(12) United States Patent
Tomita (10) Patent No.: US 11,387,536 B2
(45) Date of Patent: Jul. 12, 2022

(54) MOUNT COMPONENT AND MODULE

(71) Applicant: Murata Manufacturing Co., Ltd., Kyoto (JP)

(72) Inventor: Takayuki Tomita, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 22 days.

(21) Appl. No.: 16/850,163

(22) Filed: Apr. 16, 2020

(65) Prior Publication Data
US 2020/0335845 A1 Oct. 22, 2020

(30) Foreign Application Priority Data

Apr. 17, 2019 (JP) .............................. JP2019-078367

(51) Int. Cl.
*H01P 5/18* (2006.01)
(52) U.S. Cl.
CPC .................................... *H01P 5/184* (2013.01)
(58) Field of Classification Search
CPC ................................. H01P 5/18; H01P 5/184
USPC ......................................... 333/109–112, 116
See application file for complete search history.

(56) References Cited

U.S. PATENT DOCUMENTS

| 6,624,722 | B2 * | 9/2003 | Wang ..................... H01P 5/184 333/111 |
| 7,567,146 | B2 * | 7/2009 | Tervo ..................... H01P 5/183 333/109 |
| 2013/0141184 | A1 | 6/2013 | Tamaru et al. |
| 2015/0207541 | A1 | 7/2015 | Kuroda |
| 2016/0079649 | A1 * | 3/2016 | Ilkov ................... H04B 1/0458 343/853 |

FOREIGN PATENT DOCUMENTS

| JP | 60250264 A | * 12/1985 |
| JP | 2013-102367 A | 5/2013 |
| JP | 2014-033432 A | 2/2014 |
| WO | 2012/017713 A1 | 2/2012 |

* cited by examiner

*Primary Examiner* — Dean O Takaoka
(74) *Attorney, Agent, or Firm* — Pearne & Gordon LLP (57) ABSTRACT

Provided is a mount component that is for forming a directional coupler consisting of a main line and a sub line. Out of the main line and the sub line, only the sub line is formed on or in the mount component. The main line is formed on or in a mounting substrate on which the mount component is mounted and is not formed on or in the mount component. When the mount component is mounted on the mounting substrate, the main line and the sub line electromagnetically couple with each other and as a result a directional coupler is formed.

11 Claims, 9 Drawing Sheets

MOUNT COMPONENT AND MODULE

This application claims priority from Japanese Patent Application No. 2019-078367 filed on Apr. 17, 2019. The content of this application is incorporated herein by reference in its entirety.

BACKGROUND

The present disclosure relates to a mount component and a module and more particularly relates to a mount component for forming a directional coupler.

A directional coupler is a basic element that is widely used in wireless devices such as mobile terminal devices (for example, refer to International Publication No. 2012/017713).

Recently, in response to demands for higher performances in wireless devices, directional couplers have been required to have lower distortion and lower loss.

BRIEF SUMMARY

Accordingly, the present disclosure provides a mount component that is suitable for forming a directional coupler that is excellent in terms of low distortion and low loss and to provide a module that includes a directional coupler formed using this directional coupler.

An embodiment of the present disclosure provides a mount component that is a mount component for forming a directional coupler consisting of or comprising a main line and a sub line. The sub line has a first end and a second end and outputs part of a signal transmitted along the main line as a detection signal to a coupling terminal. Out of the main line and the sub line, only the sub line is formed on or in the mount component.

In addition, an embodiment of the present disclosure provides a module that includes: a mounting substrate on or in which a main line is formed; and the above-described mount component, which is mounted on the mounting substrate. A directional coupler is formed by the main line and the sub line, which is formed on or in the mount component.

According to the mount component of the embodiment of the present disclosure, when a directional coupler consisting of or comprising a main line and sub line is formed using the mount component, the mount component includes only the sub line and does not include the main line and a connection structure for the main line.

Typically, a main line inside a mount component is thinner than an external signal line along which a main signal is transmitted, and therefore in the case where the main line is provided inside a mount component and the main signal is brought into the inside of the mount component, insertion loss in the main line inside the mount component and reflection loss in the connection structure are likely to increase. Furthermore, when the main signal is brought into the inside of the mount component, the strong electromagnetic field of a main signal is likely to reach the substrate, electrodes, elements, and so on of the mount component, and therefore the main signal is likely to become distorted. Regarding this point, insertion loss in a main line inside the mount component and reflection loss in a connection structure of the mount component are not generated in a directional coupler formed using a mount component that does not bring the main signal into the inside thereof.

Thus, a mount component that is suitable for forming a directional coupler that is excellent in terms of low distortion and low loss and a module that includes a directional coupler formed using this directional coupler can be obtained.

Other features, elements, characteristics and advantages of the present disclosure will become more apparent from the following detailed description of embodiments of the present disclosure with reference to the attached drawings.

DETAILED DESCRIPTION

A plurality of embodiments of the present disclosure will be described in detail using the drawings. The embodiments described hereafter, each illustrates a comprehensive or specific example of the present disclosure. The numerical values, shapes, materials, constituent elements, arrangement of the constituent elements, the ways in which the constituent elements are connected to each other and so forth given in the following embodiments are merely examples and are not intended to limit the present disclosure.

Embodiment 1

A mount component according to embodiment 1 will be described using an example of a mount component that is mounted on a mounting substrate and forms a directional coupler.

Figure 1:
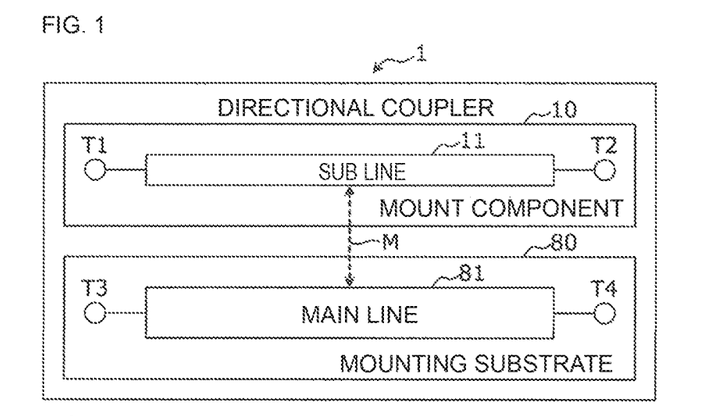
FIG. 1 is a circuit diagram illustrating an example of the functional configuration of a directional coupler according to embodiment 1.

FIG. 1 is a circuit diagram illustrating an example of the functional configuration of a directional coupler according to embodiment 1.

As illustrated in FIG. 1, a directional coupler 1 includes a mount component 10 and a mounting substrate 80.

Out of a main line 81 and a sub line 11 constituting the directional coupler 1, the main line 81 is formed in only the mounting substrate 80 and is not formed in the mount component 10. In addition, the sub line 11 is formed in the mount component 10. When the mount component 10 is mounted on the mounting substrate 80, the main line 81 and the sub line 11 electromagnetically couple with each other (reference symbol M in FIG. 1) and the mount component 10 thereby functions as the directional coupler 1.

In a state where a second end T2 of the sub line 11 is terminated, part of a main signal, which is transmitted along the main line 81 in a forward direction from a first end T3 of the main line 81 toward a second end T4 of the main line 81, is output from a first end T1 of the sub line 11 as a forward-direction detection signal. Furthermore, in a state where the first end T1 of the sub line 11 is terminated, part of the main signal, which is transmitted along the main line 81 in a reverse direction from the second end T4 of the main line 81 toward the first end T3 of the main line 81, is output from the second end T2 of the sub line 11 as a reverse-direction detection signal.

In other words, in the case where a detection signal is obtained for a forward-direction main signal, the second end T2 of the sub line 11 is the terminated end of the sub line 11 and the first end T1 of the sub line 11 is the signal output end of the sub line 11. Furthermore, in the case where a detection signal is obtained for a reverse-direction main signal, the first end T1 of the sub line 11 is the terminated end of the sub line 11 and the second end T2 of the sub line 11 is the signal output end of the sub line 11.

The forward direction and the reverse direction may be defined in the opposite way to that described above.

In the directional coupler 1, a circuit that is connected to the first end T3 and the second end T4 of the main line 81 and the first end T1 and the second end T2 of the sub line 11 is not particularly limited. For example, the ends T1 to T4 may be individually connected to corresponding external terminals (not illustrated). In other words, the directional coupler 1 may be formed as a four-terminal directional coupler. In addition, as described later, the terminated end of the sub line 11, out of the first end T1 and the second end T2 of the sub line 11, may be terminated inside the directional coupler 1 and the signal output end of the sub line 11 may be connected to a functional circuit provided inside the directional coupler 1.

When a directional coupler consisting of or comprising the main line 81 and the sub line 11 is formed by mounting the mount component 10 on the mounting substrate 80, the mount component 10 includes only the sub line 11 and does not include the main line 81 or a connection structure for the main line 81 (wiring line, via conductor and so forth for connecting the main line 81 and an external element).

Typically, a main line provided inside a mount component is thinner than a signal line that is provided outside the mount component and along which a main signal is transmitted, and therefore in the case where the main line is provided inside the mount component and the main signal is brought into the inside of the mount component, insertion loss in the main line inside the mount component and reflection loss in the main line connection structure are likely to increase.

Furthermore, when the main line is provided inside the mount component and the main signal is brought into the inside of the mount component, the strong electromagnetic field of a main signal is likely to reach the substrate, electrodes, elements, and so on of the mount component, and therefore the main signal is likely to become distorted. Specifically, when the mount component includes a semiconductor substrate composed of silicon or the like (and an insulating part stacked on top of the semiconductor substrate), the insulating part will have non-linear properties, and therefore the main signal is likely to be become distorted when brought into the inside of the mount component. Furthermore, even if the mount component includes a substrate composed of another material such as a dielectric, if a semiconductor component is arranged close to the main line, an eddy current generated due to the electromagnetic field of the main line reaching the semiconductor component will be distorted due to non-linear changes in the resistivity of the substrate and the main signal is also likely to become distorted.

Regarding this point, insertion loss in a main line inside a mount component and reflection loss in a connection structure for the main line are not generated in the directional coupler 1, which is formed using the mount component 10 which does not bring the main signal into the inside thereof. Furthermore, even if a failure occurs in the mount component 10, the main signal will not interrupted, and therefore operation of the device can be made to continue by performing appropriate control, and deterioration of the reliability of the device can be suppressed.

Thus, the mount component 10, which is suitable for forming a directional coupler that is excellent in terms of low distortion and low loss, can be obtained and the directional coupler 1 that includes the mount component 10 can be obtained.

Next, a specific mounting structure of the directional coupler 1 will be described.

Figure 2A:
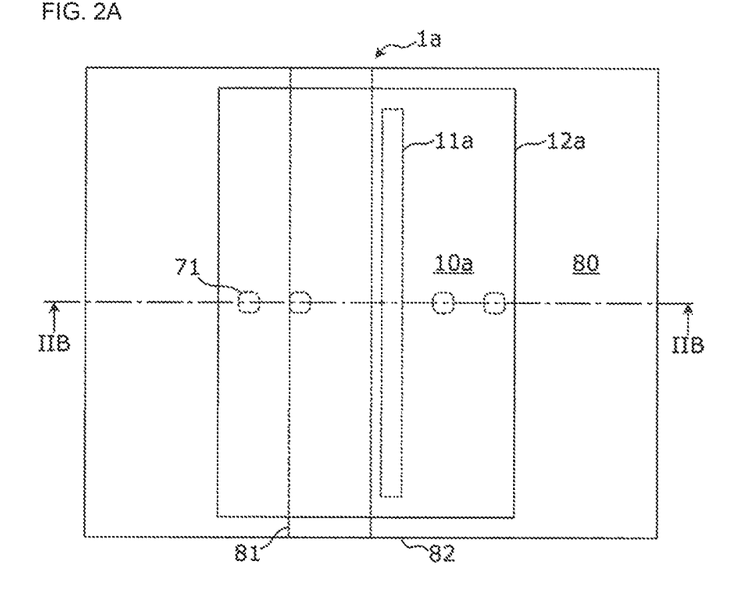
FIG. 2A is a plan view illustrating a first example of the structure of the directional coupler according to embodiment 1.
Figure 2B:
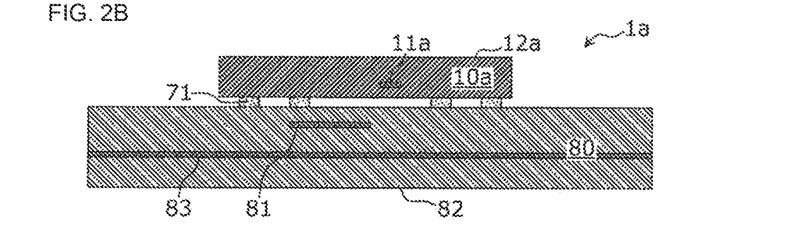
FIG. 2B is a side view illustrating the first example of the structure of the directional coupler according to embodiment 1.

FIGS. 2A and 2B are respectively a plan view and a side view of a first example of a mounting structure of the directional coupler 1. In FIGS. 2A and 2B, the directional coupler 1 is referred to as a directional coupler 1a.

As illustrated in FIGS. 2A and 2B, the directional coupler 1a is formed by mounting a mount component 10a on the mounting substrate 80. The mount component 10a is an example of the mount component 10, which is for forming a directional coupler, and the mounting substrate 80 is the substrate of a device that uses a directional coupler formed using the mount component 10a.

For example, the mounting substrate 80 is a wiring substrate obtained by arranging the main line 81 and a ground electrode 83 in a dielectric substrate 82 consisting of or comprising one or more substrate layers formed of a resin material, which is a dielectric material. The main line 81 and the ground electrode 83 are formed of thick metal films that include copper or the like.

For example, the mount component 10a is a component in which a sub line 11a is arranged in a dielectric substrate 12a composed of one or more substrate layers formed of a ceramic or a resin material, which are dielectric materials. The sub line 11a is formed of a metal foil containing silver, copper, or the like or a thick metal film containing silver, copper, or the like.

The mount component 10a is mounted on the mounting substrate 80 by bonding connection electrodes (not illustrated), which are provided on facing surfaces of the mount component 10a and the mounting substrate 80, to each other using an electrically conductive bonding material 71 such as solder.

With this mounting structure, the mount component 10a can be manufactured easily and inexpensively using typical manufacturing techniques used for ceramic multilayer substrates and multilayer printed wiring substrates.

Figure 3A:
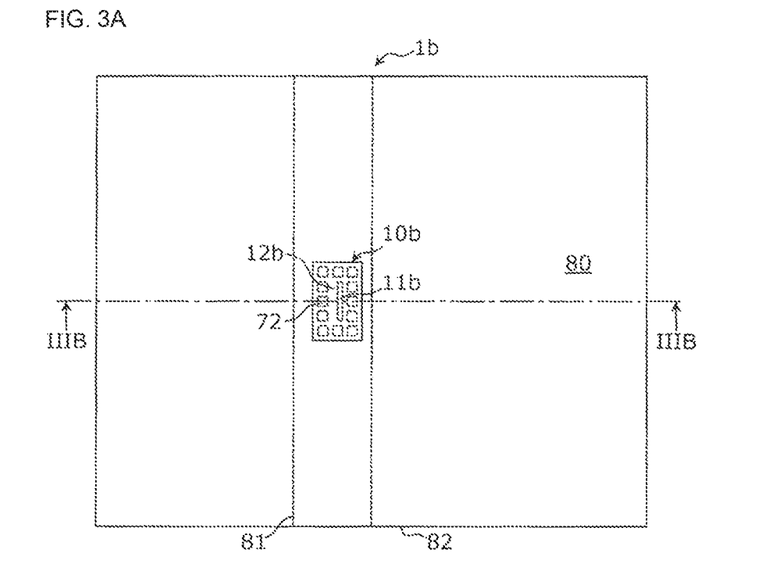
FIG. 3A is a plan view illustrating a second example of the structure of the directional coupler according to embodiment 1.
Figure 3B:
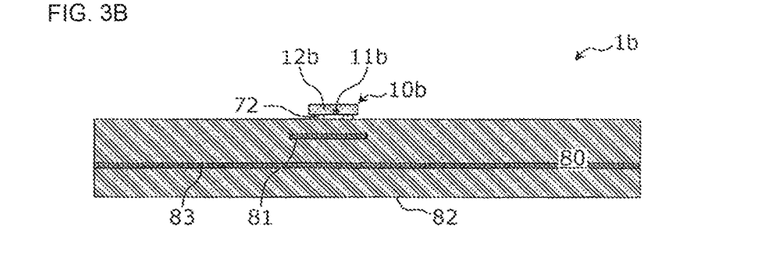
FIG. 3B is a side view illustrating the second example of the structure of the directional coupler according to embodiment 1.

FIGS. 3A and 3B are respectively a plan view and a side view of a second example of a mounting structure of the directional coupler 1. In FIGS. 3A and 3B, the directional coupler 1 is referred to as a directional coupler 1b.

As illustrated in FIGS. 3A and 3B, the directional coupler 1b is formed by mounting a mount component 10b on the mounting substrate 80. The mount component 10b is an example of the mount component 10, which is for forming a directional coupler, and the mounting substrate 80 is the substrate of a device that uses a directional coupler formed using the mount component 10b.

The mounting substrate 80 has the same structure as the mounting substrate 80 of the directional coupler 1a.

The mount component 10b is a semiconductor chip component in which a sub line 11b is arranged in a semiconductor substrate 12b composed of a semiconductor material such as silicon. The sub line 11b is formed of a thin metal film that contains copper, aluminum, or the like.

The mount component 10b is mounted on the mounting substrate 80 by bonding connection electrodes (not illustrated), which are provided on facing surfaces of the mount component 10b and the mounting substrate 80, to each other using an electrically conductive bonding material 72 such as solder. The mount component 10b may be a chip size package that is flip-chip mounted on the mounting substrate 80 and the space between the mount component 10b and the mounting substrate 80 may be filled with an underfill resin. Capacitive coupling between the main line 81 and the sub line 11b can be increased by using an underfill resin.

With the above-described mounting structure, the mount component 10b can be manufactured so as to be small in size and with high form accuracy by using general semiconductor processes. In particular, for the case where the frequency of the signal that is to be detected is high (for example, 3 GHz or higher), the mount component 10b can be obtained in which the sub line 11b is shorter than the sub line 11a and consequently there is no need for a large-sized semiconductor substrate 12b and there is an advantage in terms of cost.

Embodiment 2

A mount component according to embodiment 2 will be described using an example of a mount component having a reconfigurable sub line.

Figure 4:
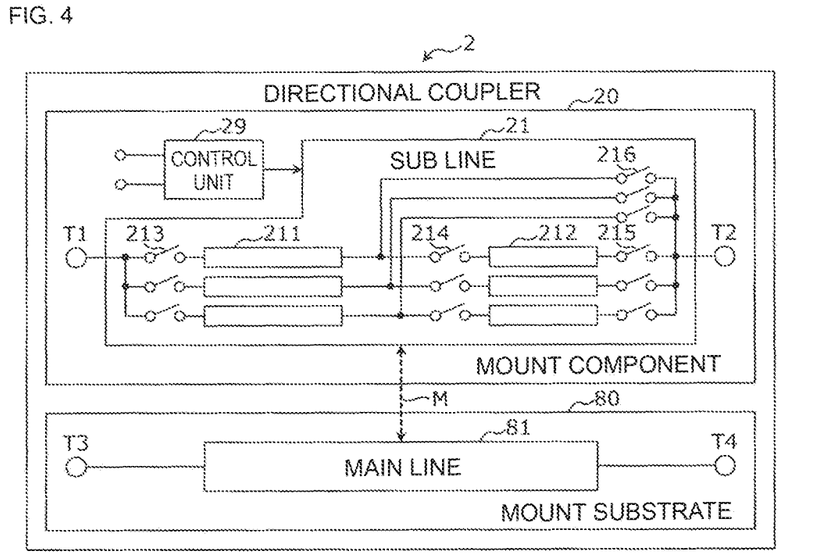
FIG. 4 is a circuit diagram illustrating an example of the functional configuration of a directional coupler according to embodiment 2.

FIG. 4 is a circuit diagram illustrating an example of the functional configuration of a directional coupler according to embodiment 2.

As illustrated in FIG. 4, a directional coupler 2 differs from the directional coupler 1 in FIG. 1 in that a sub line 21 is changed and a control unit 29 is added.

The directional coupler 2 includes a plurality of lines 211 and 212 and a plurality of first switches 213 to 216 that select one or more lines from among the plurality of lines 211 and 212. In the example in FIG. 4, three of each of the lines 211 and 212 and the first switches 213 to 216 are provided. In FIG. 4, for simplicity of illustration, the reference symbols for the lines 211 and 212 and the first switches 213 to 216 are each provided for just one element representing that type of element.

The plurality of lines 211 and 212 are lines having prescribed degrees of coupling that determine the degree of coupling of the directional coupler 2 with the main line 81, among lines that electromagnetically couple with the main line 81, when a mount component 20 is mounted on the mounting substrate 80. In FIG. 4, the length of the lines 211 and the length of the lines 212 are different from each other. Furthermore, the plurality of lines 211 and the plurality of lines 212 are each at different distances from the main line 81.

The first switches 213 to 216 and wiring lines connected between the first switches 213 to 216 and the lines 211 and 212 slightly electromagnetically couple with the main line 81. However, the degrees of coupling between the first switches 213 to 216 and the main line 81 and the degrees of coupling between the wiring lines and the main line 81 are not prescribed degrees of coupling that determine the degree of coupling of the directional coupler 2. Therefore, the first switches 213 to 216 and the wiring lines connected between the first switches 213 to 216 and the lines 211 and 212 are not included in the lines forming the sub line 21.

Furthermore, when there are external elements that are connected to the first end T1 and the second end T2 of the sub line 21, connection structures such as a wiring line and a via conductor connected between the first end T1 and an external element and connection structures such as a wiring line and a via conductor connected between the second end T2 and an external element also slightly electromagnetically couple with the main line 81. However, the degrees of coupling between these wiring lines and the main line 81 are not degrees of coupling that determine the degree of coupling of the directional coupler 2. Therefore, wiring lines and connection structures connected between the sub line 21 and external elements are not included in the lines forming the sub line 21.

The control unit 29 receives a data signal representing the respective conductive states and non-conductive states of the first switches 213 to 216 and switches the first switches 213 to 216 to the respective conductive states and non-conductive states represented by the received data signal.

In the directional coupler 2, the sub line 21 is formed of one or more of the lines 211 and 212, from among the plurality of lines 211 and 212, connected by the first switches 213 to 216.

For example, in the case where the first switches 213 and 216 are in a conductive state and the first switches 214 and 215 are in a non-conductive state, the sub line 21 is formed of only the lines 211. More specifically, among the three lines 211, the sub line 21 is formed of the lines 211 that are connected to the first switches 213 that are in a conductive state out of the three first switches 213 and the first switches 216 that are in a conductive state out of the three first switches 216.

In addition, for example, in the case where the first switches 213, 214, and 215 are in a conductive state and the first switches 216 are in a non-conductive state, the sub line 21 is formed of the lines 211 and 212. More specifically, the sub line 21 is formed by the lines 211 that are connected to the first switches 213 that are in a conductive state out of the three first switches 213 and the first switches 214 that are in a conductive state out of the three first switches 214 among the three lines 211 and the lines 212 that are connected to the first switches 214 that are in a conductive state out of the three first switches 214 and the first switches 215 that are in a conductive state out of the three first switches 215 among the three lines 212 being connected to each other.

Thus, when the mount component 20 is mounted on the mounting substrate 80, the main line 81 and the sub line 21, which is formed of one or more lines 211 and 212 connected to each other by the first switches 213 to 216, electromagnetically couple with each other (reference symbol M in FIG. 4) and as a result the mount component 20 functions as the directional coupler 2.

Next, a specific mounting structure of the directional coupler 2 will be described.

Figure 5A:
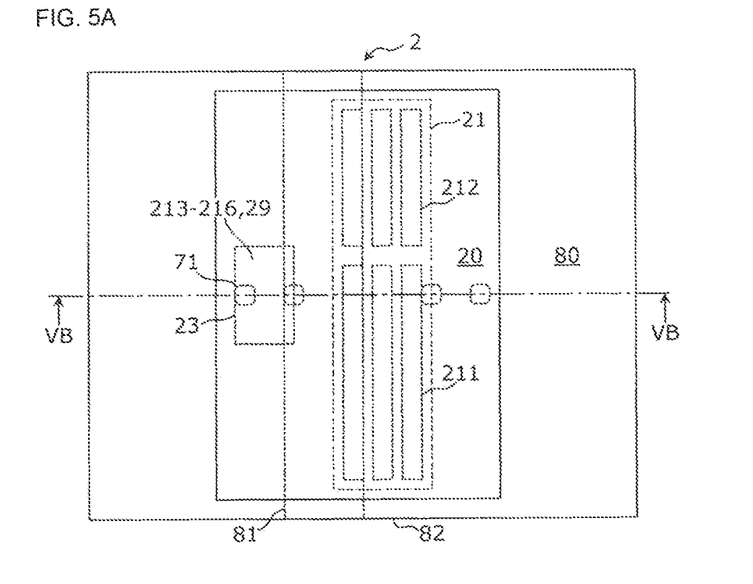
FIG. 5A is a plan view illustrating an example of the structure of the directional coupler according to embodiment 2.
Figure 5B:
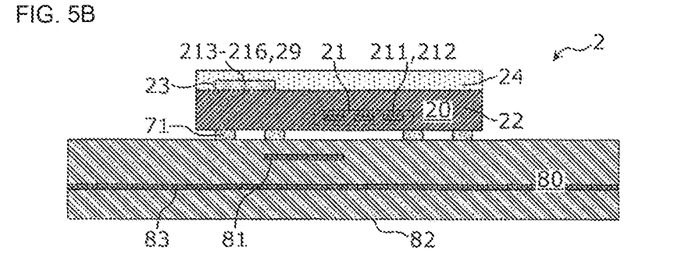
FIG. 5B is a side view illustrating the example of the structure of the directional coupler according to embodiment 2.

FIGS. 5A and 5B are respectively a plan view and a side view of an example of a mounting structure of the directional coupler 2.

As illustrated in FIGS. 5A and 5B, the directional coupler 2 is formed by mounting the mount component 20 on the mounting substrate 80. The mounting substrate 80 is a substrate of a device that uses a directional coupler forming using the mount component 20.

The mounting substrate 80 has the same structure as the mounting substrate 80 of the directional coupler 1a.

The mount component 20 is formed by molding a resin 24 on a dielectric substrate 22 in which the lines 211 and 212 are arranged and on which a semiconductor chip 23 is mounted. For example, an epoxy resin is used as the resin 24.

The dielectric substrate 22 consists of or comprises one or more substrate layers formed of a ceramic or resin material, which are dielectric materials, and the lines 211 and 212 are formed of thick metal films containing silver or copper.

The first switches 213 to 216 and the control unit 29 are provided in the semiconductor chip 23. The circuit of the mount component 20 illustrated in FIG. 4 is formed by connecting the first switches 213 to 216 and the lines 211 and 212 to each other using wiring lines (not illustrated) provided in the dielectric substrate 22.

The semiconductor chip 23 may be a chip size package that is flip chip mounted on the dielectric substrate 22 and the space between the semiconductor chip 23 and the dielectric substrate 22 may be filled with an underfill resin.

A metal film (not illustrated) formed by sputtering or plating may be formed as a shield film on at least part of the top surface and the side surface of the resin 24.

The mount component 20 is mounted on the mounting substrate 80 by bonding connection electrodes (not illustrated), which are provided on facing surfaces of the mount component 20 and the mounting substrate 80, to each other using an electrically conductive bonding material 71 such as solder.

According to the directional coupler 2, the sub line 21 can be reconfigured using the plurality of lines 211 and 212 and the first switches 213 to 216. Therefore, the degree of coupling and directivity of the directional coupler 2 can be dynamically adjusted after the mount component 20 has been mounted on the mounting substrate 80.

More specifically, in an actual mounting structure, the degree of coupling and the directivity of a directional coupler will vary from the desired values due to the solder mounting positions (alignment) and solder amounts of the mount component, as well as the substrate thickness and processing accuracy of the mount component and mounting substrate.

Regarding this point, according to the directional coupler 2, the degree of coupling of the directional coupler 2 can be appropriately compensated by reconfiguring the sub line 21 by connecting lines that have appropriate lengths and are at appropriate distances from the main line 81 from among the lines 211 and 212. Furthermore, in addition to compensating for undesirable variations, it is also possible to provide a plurality of lines that are suitable for detecting signals of different frequencies and the lines can be switched between in accordance with the frequency of the signal that is to be detected. Thus, a directional coupler that has a wide operation band and can appropriately realize a desired degree of coupling and a desired directivity can be obtained.

FIG. 4 illustrates an example in which the lines 211 and the lines 212 have different lengths from each other, but the lengths of the lines 211 and the lengths of the lines 212 may instead be identical. In addition, FIG. 4 illustrates an example in which three of each of the first switches 213 to 216, the lines 211, and the lines 212 are provided, but alternatively one, two, four or more of each of these elements may be provided.

Embodiment 3

A mount component according to embodiment 3 will be described using another example of a mount component having a reconfigurable sub line.

Figure 6:
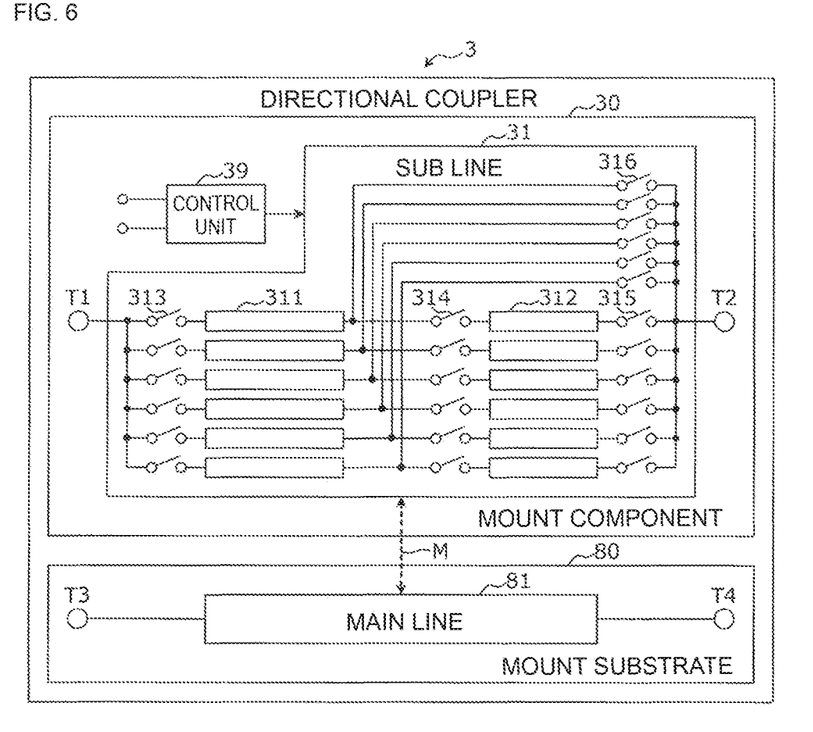
FIG. 6 is a circuit diagram illustrating an example of the functional configuration of a directional coupler according to embodiment 3.

FIG. 6 is a circuit diagram illustrating an example of the functional configuration of a directional coupler according to embodiment 3.

As illustrated in FIG. 6, a directional coupler 3 differs from the directional coupler 2 in FIG. 4 in that 6 of each of lines 311 and 312 and first switches 313 to 316 are provided.

The lines 311 and 312 and the first switches 313 to 316 in the directional coupler 3 respectively correspond to the lines 211 and 212 and the first switches 213 to 216 in the directional coupler 2. Furthermore, a sub line 31 and a control unit 39 in the directional coupler 3 respectively correspond to the sub line 21 and the control unit 29 in the directional coupler 2.

In the directional coupler 3, the sub line 31 is formed of one or more of the lines 311 and 312, from among the plurality of lines 311 and 312, connected by the first switches 313 to 316. Thus, when the mount component 30 is mounted on the mounting substrate 80, the main line 81 and the sub line 31, which is formed of one or more lines 311 and 312 connected to each other by the first switches 313 to 316, electromagnetically couple with each other (reference symbol M in FIG. 6) and as a result a mount component 30 functions as the directional coupler 3.

In addition, similarly to as was described for the directional coupler 2, in the directional coupler 3 as well, the first switches 313 to 316 and wiring lines connected between the first switches 313 to 316 and the lines 311 and 312 are not included in the lines forming the sub line 31.

Next, a specific mounting structure of the directional coupler 3 will be described.

Figure 7A:
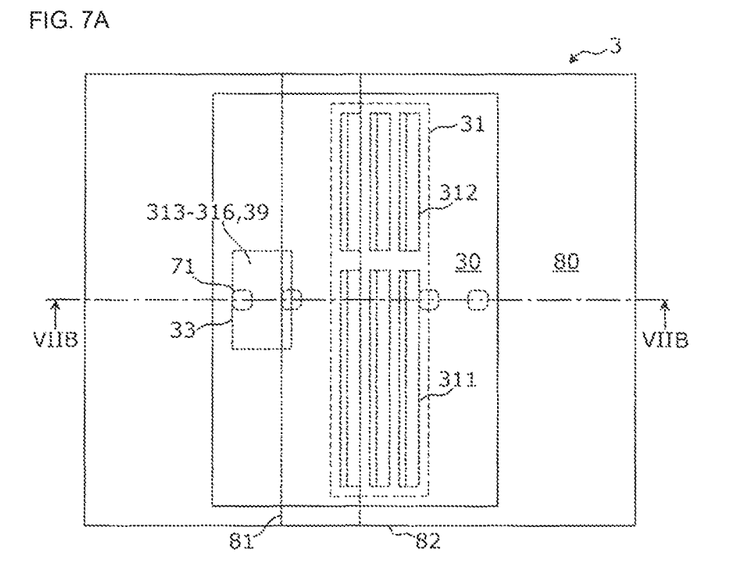
FIG. 7A is a plan view illustrating an example of the structure of the directional coupler according to embodiment 3.
Figure 7B:
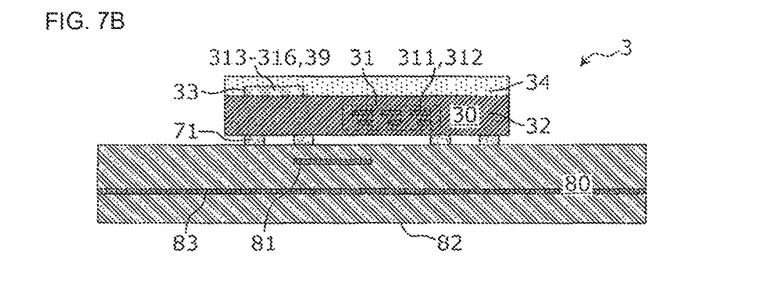
FIG. 7B is a side view illustrating the example of the structure of the directional coupler according to embodiment 3.

FIGS. 7A and 7B are respectively a plan view and a side view of an example of a mounting structure of the directional coupler 3.

As illustrated in FIGS. 7A and 7B, the directional coupler 3 differs from the directional coupler 2 illustrated in FIGS.

5A and 5B in that three of each of the lines 311 and 312 are arranged in two layers inside a dielectric substrate 32.

The dielectric substrate 32, a semiconductor chip 33, and resin 34 in the directional coupler 3 respectively correspond to the dielectric substrate 22, the semiconductor chip 23, and the resin 24 in the directional coupler 2. The materials and structural features of the constituent elements of the directional coupler 3 are identical to the materials and structural features of the corresponding constituent elements of the directional coupler 2 and therefore description thereof is omitted.

According to the directional coupler 3, the sub line 31 can be reconfigured using the plurality of lines 311 and 312 and the first switches 313 to 316. Therefore, the degree of coupling and directivity of the directional coupler 3 can be dynamically adjusted after the mount component 30 has been mounted on the mounting substrate 80.

More specifically, in an actual mounting structure, the degree of coupling and the directivity of a directional coupler will vary from the desired values due to the solder mounting positions (alignment) and solder amounts of the mount component, as well as the substrate thickness and processing accuracy of the mount component and mounting substrate.

Regarding this point, according to the directional coupler 3, the degree of coupling of the directional coupler 3 can be appropriately compensated by reconfiguring the sub line 31 by connecting appropriate lines from among the lines 311 and 312. Furthermore, in addition to compensating for undesirable variations, it is also possible to provide a plurality of lines that are suitable for detecting signals of different frequencies and the lines can be switched between in accordance with the frequency of the signal that is to be detected. Thus, a directional coupler that has a wide operation band and can appropriately realize a desired degree of coupling and a desired directivity can be obtained. Compared with the directional coupler 2, in the directional coupler 3, a larger number of lines can be provided in the same area in plan view and used to reconfigure the sub line and therefore it is possible to further improve the range and accuracy of adjustable characteristics.

Embodiment 4

A mount component according to embodiment 4 will be described using an example of a mount component that includes switches that switch the detection direction of a main signal.

Figure 8:
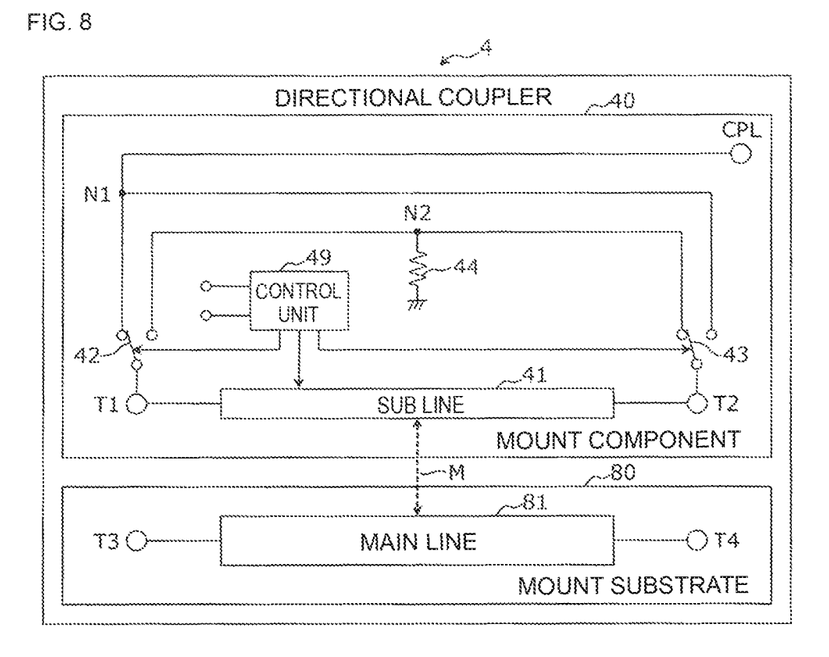
FIG. 8 is a circuit diagram illustrating an example of the functional configuration of a directional coupler according to embodiment 4.

FIG. 8 is a circuit diagram illustrating an example of the functional configuration of a directional coupler according to embodiment 4.

As illustrated in FIG. 8, a directional coupler 4 differs from the directional coupler 1 in FIG. 1 in that a sub line 41 and a control unit 49 are changed and second switches 42 and 43, a terminator 44, and a coupling port CPL are added.

Any sub line from among the sub lines 11, 21, and 31 described in embodiments 1, 2, and 3 may be used for the sub line 41.

The second switches 42 and 43 connect the first end T1 of the sub line 41 to a first node N1 and connect the second end T2 of the sub line 41 to a second node N2 or connect the first end T1 of the sub line 41 to the second node N2 and connect the second end T2 of the sub line 41 to the first node N1. Here, the first node N1 is a signal output node that is connected to the coupling port CPL and the second node N2 is a termination node that is connected to ground. In other words, the second switches 42 and 43 switch between a state in which the first end T1 of the sub line 41 is connected to the coupling port CPL and the second end T2 of the sub line 41 is connected to ground and a state in which the first end T1 of the sub line 41 is connected to ground and the second end T2 of the sub line 41 is connected to the coupling port CPL.

The terminator 44 is an impedance circuit that terminates a termination end of the sub line 41 among the first end T1 and the second end T2 of the sub line 41, and is for example a fixed resistance connected between the second node N2 and a ground electrode. Here, the second node N2 is connected to the first end T1 or the second end T2 by the second switch 42 or 43. In other words, the terminator 44 is connected between the first end T1 and the second end T2 and ground.

The coupling port CPL is a terminal for outputting a detection signal. Here, the coupling port CPL is an example of a "coupling terminal".

The control unit 49 receives a data signal representing the respective connection states of the second switches 42 and 43 and switches the second switches 42 and 43 to the respective connection states represented by the received data signal. In the case where the sub line 21 of embodiment 2 is used as the sub line 41, the control unit 49 controls the first switches 213 to 216 in addition to controlling the second switches 42 and 43. In the case where the sub line 31 of embodiment 3 is used as the sub line 41, the control unit 49 controls the first switches 313 to 316 in addition to controlling the second switches 42 and 43.

According to the thus-configured directional coupler 4, a detection signal for a main signal that is transmitted along the main line 81 in either the forward direction or the reverse direction can be output from the coupling port CPL by switching the second switches 42 and 43.

Embodiment 5

A mount component according to embodiment 5 will be described using an example of a mount component having a variety of variable elements for adjusting the characteristics of the directional coupler.

Figure 9:
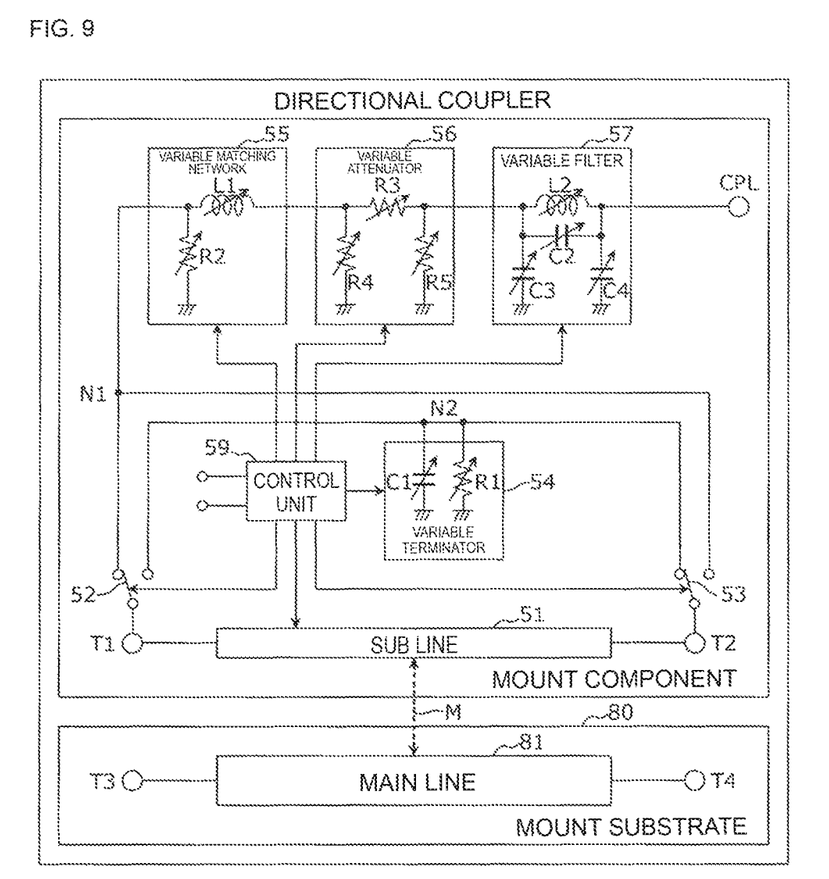
FIG. 9 is a circuit diagram illustrating an example of the functional configuration of a directional coupler according to embodiment 5.

FIG. 9 is a circuit diagram illustrating an example of the functional configuration of a directional coupler according to embodiment 5.

As illustrated in FIG. 9, a directional coupler 5 differs from the directional coupler 4 in FIG. 8 in that a variable terminator 54 is changed and in that a variable matching network 55, a variable attenuator 56, and a variable filter 57 are added.

A sub line 51, second switches 52 and 53, and a control unit 59 in the directional coupler 5 respectively correspond to the sub line 41, the second switches 42 and 43, and the control unit 49 in the directional coupler 4. Any sub line from among the sub lines 11, 21, and 31 described in embodiments 1, 2, and 3 may be used for the sub line 51.

The variable terminator 54 is a termination circuit in which the resistance and the reactance can be varied and is for terminating a termination end of the sub line 51 among the first end T1 and the second end T2 of the sub line 51, and the variable terminator 54 is mainly used to optimize the directivity of the directional coupler 5. The variable terminator 54 is for example is formed of a circuit in which a variable capacitor C1 and a variable resistor R1 are connected in parallel with each other and is connected between the second node N2 and ground. Here, the second node N2 is connected to the first end T1 or the second end T2 by the second switch 42 or 43. In other words, the variable terminator 54 is connected between the first end T1 and the second end T2 and ground.

The variable matching network 55 is a circuit for bringing the impedance at a signal output end of the sub line 51 among the first end T1 and the second end T2 of the sub line 51 close to a circuit reference impedance and the variable matching network 55 is mainly used to optimize the directivity of the directional coupler 5. The variable matching network 55 is for example provided on a signal path connected between the first node N1 and the coupling port CPL and includes a variable inductor L1, which forms part of the signal path, and a variable resistor R2 that is connected between one end of the variable inductor L1 and ground. Here, the first node N1 is connected to the first end T1 or the second end T2 by the second switch 42 or 43. In other words, the variable matching network 55 is connected between the first end T1 and the second end T2 and the coupling port CPL.

The variable attenuator 56 is a circuit for adjusting the passing loss of a detection signal obtained from the signal output end of the sub line 51 among the first end T1 and the second end T2 of the sub line 51 and is mainly used to optimize the degree of coupling of the directional coupler 5. The variable attenuator 56 is for example provided on a signal path connected between the first node N1 and the coupling port CPL and includes a variable resistor R3 that forms part of the signal path, a variable resistor R4 that is connected between one end of the variable resistor R3 and ground, and a variable resistor R5 that is connected between the other end of the variable resistor R3 and ground. Here, the first node N1 is connected to the first end T1 or the second end T2 by the second switch 42 or 43. In other words, the variable attenuator 56 is connected between the first end T1 and the second end T2 and the coupling port CPL.

The variable filter 57 is a circuit for adjusting the frequency characteristics of a detection signal obtained from the signal output end of the sub line 51 among the first end T1 and the second end T2 of the sub line 51 and is mainly used to optimize the frequency characteristics of the degree of coupling of the directional coupler 5. The variable filter 57 is for example provided on a signal path connected between the first node N1 and the coupling port CPL and includes a variable inductor L2 that forms part of the signal path, a variable capacitor C2 that is connected in parallel with the variable inductor L2, a variable capacitor C3 that is connected between one end of the variable inductor L2 and ground, and a variable capacitor C4 that is connected between the other end of the variable inductor L2 and ground. Here, the first node N1 is connected to the first end T1 or the second end T2 by the second switch 42 or 43. In other words, the variable filter 57 is connected between the first end T1 and the second end T2 and the coupling port CPL.

A variable inductor, a variable capacitor, and a variable resistor used as these variable elements may be realized in the following manner as an example.

Figure 10A:
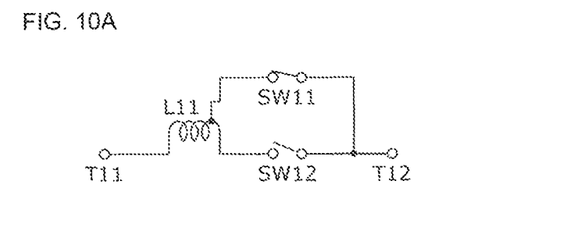
FIG. 10A is a circuit diagram illustrating an example of the configuration of a variable inductor according to embodiment 5.
Figure 10B:
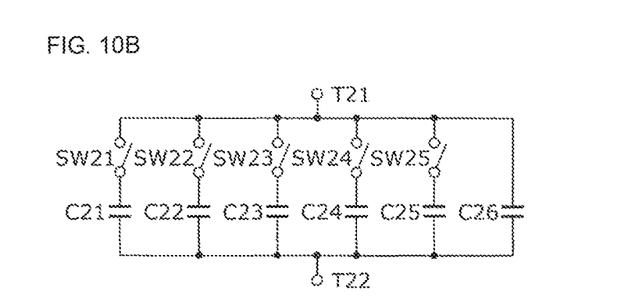
FIG. 10B is a circuit diagram illustrating an example of the configuration of a variable capacitor according to embodiment 5.
Figure 10C:
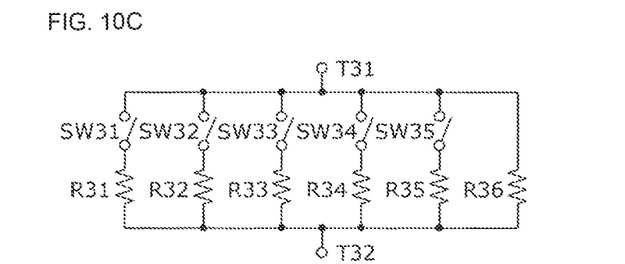
FIG. 10C is a circuit diagram illustrating an example of the configuration of a variable resistor according to embodiment 5.

FIGS. 10A, 10B, and 10C are circuit diagrams that respectively illustrate example configurations of a variable inductor, a variable capacitor, and a variable resistor. The variable inductor, the variable capacitor, and the variable resistor illustrated in FIGS. 10A, 10B, and 10C are each realized by selecting a plurality of elements or an element having fixed constants using switches.

With the variable terminator 54, the variable matching network 55, the variable attenuator 56, and the variable filter 57 that use the thus-realized variable inductor, variable capacitor, and variable resistor, the circuit constants can be easily changed in accordance with control performed by the control unit 59.

According to the directional coupler 5, the degree of coupling and the directivity of the directional coupler 5 can be adjusted by changing the circuit constants of the variable terminator 54, the variable matching network 55, the variable attenuator 56, and the variable filter 57 in addition to reconfiguring the sub line 51. Thus, for example, a directional coupler can be obtained that has a function of adjusting characteristics so as to be the same as those in a case where the variable terminator 54, the variable matching network 55, the variable attenuator 56, and the variable filter 57 are not used in a mount component that has been reduced in size by reducing the number of lines used for reconfiguring the sub line 51.

Embodiment 6

A module according to embodiment 6 will be described using an example of a module that includes a directional coupler in which a mount component described above is mounted on a mounting substrate.

Figure 11A:
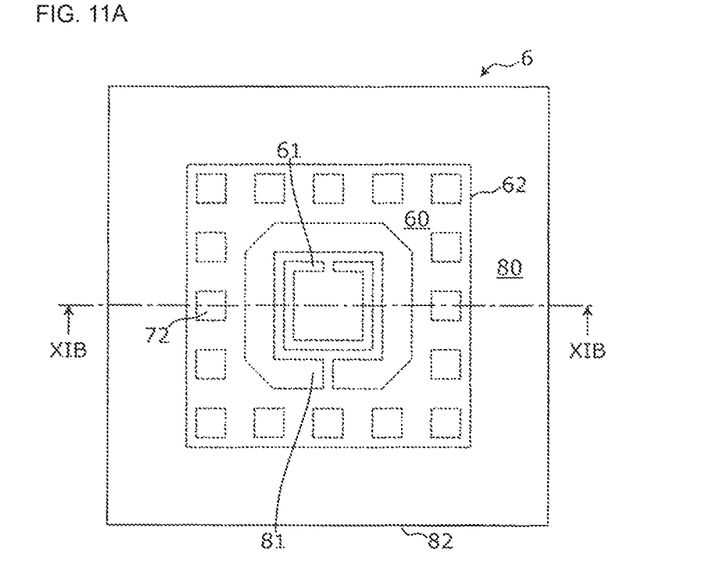
FIG. 11A is a plan view illustrating an example of the structure of a module according to embodiment 6.
Figure 11B:
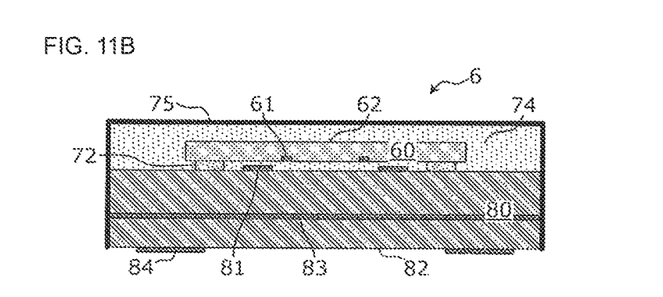
FIG. 11B is a side view illustrating the example of the structure of the module according to embodiment 6.

FIGS. 11A and 11B are respectively a plan view and a side view illustrating an example of a mounting structure of the module according to embodiment 6.

As illustrated in FIGS. 11A and 11B, a module 6 is formed by mounting a mount component 60, in which a sub line 61 is formed, on a mounting substrate 80 on which the main line 81 is formed.

A metal film 75 formed by sputtering or plating may be formed as a shield film on at least part of the top surface and the side surface of resin 74. The metal film 75 is for example formed of at least one metal among titanium, copper, and nickel or an alloy of any of these metals.

The mounting substrate 80 is a wiring substrate obtained by arranging the main line 81, a ground electrode 83, and outer terminals 84 on and in a dielectric substrate 82 consisting of or comprising one or more substrate layers formed of a resin material, which is a dielectric material. The main line 81, the ground electrode 83, and the outer terminals 84 are formed of thick metal films containing copper and are respectively provided on one main surface, an inner layer, and the other main surface of the mounting substrate 80. The main line 81 may instead be provided on an inner layer of the mounting substrate 80.

The mount component 60 is a semiconductor chip component in which the sub line 61 is arranged in a semiconductor substrate 62 composed of a semiconductor material such as silicon. The sub line 61 is formed of a thin metal film that contains copper, aluminum, or the like.

The mount component 60 is flip chip mounted on the mounting substrate 80 using electrically conductive bonding material 72 such as solder bumps and the resin 74 is molded onto the mount component 60. For example, an epoxy resin is used as the resin 74. The space between the mount component 60 and the mounting substrate 80 may be filled with an underfill resin.

In addition, although not illustrated, the module 6 may be provided with a reconfigurable sub line as described in embodiments 2 and 3, may be provided with switches for switching the detection direction of the main signal as described in embodiment 4, and may be provided with a variety of variable elements for adjusting characteristics as described in embodiment 5.

As illustrated in FIG. 11A, in a plan view of the module 6, the main line 81 and the sub line 61 are both provided so as to have substantially notched annular shapes and the sub line 61 is arranged so as to fit inside the inner diameter of the main line 81.

In the actual mounting structure, variations may occur in the position of the sub line 61 relative to the main line 81 due to the solder mounting positions (alignment) of the mount component and processing accuracy. Regarding this point, with the planar arrangement of the main line 81 and the sub line 61 illustrated in FIG. 11A, in the case where part of the sub line 61 is shifted closer to the main line 81, the remaining part of the sub line 61 will be further away from the main line 81, and therefore the change in the degree of coupling between the main line 81 and the sub line 61 is suppressed. As a result, the amount of adjustment of characteristics to be performed using the reconfigurable sub line and the various variable elements is reduced and therefore the need for additional circuits and sub lines for making large-scale adjustments is eliminated and this helps in reducing the size of the device.

The mount components and module described above have been described on the basis of embodiments, and the present disclosure is not limited to the individual embodiments. Various modifications, as thought of by those skilled in the art, made to the embodiments and other embodiments formed by combining constituent elements of different embodiments may also be included in the scope of one or a plurality of modes of the present disclosure so long as the modifications and embodiments do not depart from the spirit of the present disclosure.

The present disclosure can be widely used in wireless devices such as mobile terminal devices as a mount component for forming a directional coupler and as a module.

While embodiments of the disclosure have been described above, it is to be understood that variations and modifications will be apparent to those skilled in the art without necessarily departing from the scope and spirit of the disclosure. The scope of the disclosure, therefore, is to be determined solely by the following claims.

What is claimed is:

1. A directional coupler comprising:
   a mount component;
   a main line;
   a sub line; and
   a mounting substrate on which the mount component is mounted, wherein:
   a part of a signal transmitted along the main line is output as a detection signal from the sub line to a coupling terminal,
   the sub line, but not the main line, is on or in the mount component,
   the main line is on or in the mounting substrate,
   the main line and the sub line are electromagnetically coupled with each other when the mount component is mounted on the mounting substrate, and
   the mounting substrate is a wiring substrate obtained by arranging the main line and a ground electrode in a dielectric substrate.

2. The directional coupler according to claim 1, the mount component further comprising:
   a plurality of lines; and
   a first switch configured to select one or more of the plurality of lines;
   wherein the sub line comprises the one or more lines selected by the first switch.

3. The directional coupler according to claim 1, the mount component further comprising:
   a second switch configured to selectively connect the sub line between a first state and a second state, wherein:
   when the sub line is connected in the first state, a first end of the sub line is connected to the coupling terminal and a second end of the sub line is connected to ground, and
   when the sub line is connected in the second state, the first end of the sub line is connected to ground and the second end of the sub line is connected to the coupling terminal.

4. The directional coupler according to claim 1, the mount component further comprising:
   a variable terminator that is connected between the first end and the second end of the sub line, and ground.

5. The directional coupler according to claim 1, the mount component further comprising:
   a variable matching network that is connected between the first end and the second end of the sub line, and the coupling terminal.

6. The directional coupler according to claim 1, the mount component further comprising:
   a variable attenuator that is connected between the first end and the second end of the sub line, and the coupling terminal.

7. The directional coupler according to claim 1, the mount component further comprising:
   a variable filter that is connected between the first end and the second end of the sub line, and the coupling terminal.

8. The directional coupler according to claim 1, the mount component further comprising:
   a dielectric substrate; and
   a semiconductor chip that is mounted on the dielectric substrate,
   wherein the sub line is on or in the dielectric substrate.

9. The directional coupler according to claim 1, the mount component further comprising:
   a semiconductor chip, wherein the sub line is on or in the semiconductor chip.

10. The directional coupler according to claim 2, the mount component further comprising:
    a semiconductor chip, wherein the first switch is on or in the semiconductor chip.

11. The directional coupler according to claim 3, the mount component further comprising:
    a semiconductor chip, wherein the second switch is on or in the semiconductor chip.

* * * * *